United States Patent [19]

Kostelak, Jr. et al.

[11] Patent Number: 4,992,394
[45] Date of Patent: Feb. 12, 1991

[54] SELF ALIGNED REGISTRATION MARKS FOR INTEGRATED CIRCUIT FABRICATION

[75] Inventors: Robert L. Kostelak, Jr., Morris Plains; William T. Lynch, Summit; Sheila Vaidya, Watchung, all of N.J.

[73] Assignee: AT&T Bell Laboratories, Murray Hill, N.J.

[21] Appl. No.: 387,721

[22] Filed: Jul. 31, 1989

[51] Int. Cl.$^5$ .......................................... H01L 21/70
[52] U.S. Cl. ................................ 437/229; 437/228; 437/200; 437/924
[58] Field of Search ................ 437/229, 924, 200; 255/48; 156/657

[56] References Cited

U.S. PATENT DOCUMENTS 4,233,091  11/1980  Kawabe ........................ 437/924

FOREIGN PATENT DOCUMENTS 0075229  6/1980  Japan ........................... 437/924
0004229  1/1981  Japan ........................... 437/924
0075838  5/1983  Japan ........................... 437/924
0072724  4/1984  Japan ........................... 437/924
0308318  12/1985 Japan ........................... 437/924
0100928  5/1986  Japan ........................... 437/924

OTHER PUBLICATIONS

*IEEE Transactions On Electron Devices*, vol. Ed. 28, No. 11, Nov. 1981, "Electron-Beam Lithography for Small MOSFET's", by R. K. Watts et al., pp. 1138-1345.

Primary Examiner—Brian E. Hearn
Assistant Examiner—T. Thomas
Attorney, Agent, or Firm—D. I. Caplan

[57] ABSTRACT

In order to reduce alignment errors arising in the fabrication of semiconductor integrated circuits using electron beam lithography, enhanced registration marks—(i.e., registration marks that are more easily and accurately detectable by the electron beam)—are formed at the edges of oxide layers, located at the surface of a silicon body, by means of forming metal silicide layers having edges coincident with the edges of the oxide layers. Advantageously, the enhancing of the registgration marks by forming the metal silicide is performed subsequent to any high temperature processing steps, whereby the integrity of the marks is maintained.

14 Claims, 4 Drawing Sheets

SELF ALIGNED REGISTRATION MARKS FOR INTEGRATED CIRCUIT FABRICATION

TECHNICAL FIELD

This invention relates to semiconductor integrated circuit (IC) processing techniques and more particularly to techniques for aligning (registering) the various levels of integrated circuit devices, including both MOS (Metal Oxide Semiconductor) transistors and bipolar transistor.

BACKGROUND OF THE INVENTION

Semiconductor ICs typically are fabricated by successively forming patterned layers on a top major surface of a semiconductor wafer body, typically silicon. Each of the layers typically is composed of a metal, insulator, or semiconductor material that has been patterned by a lithographic masking and etching technique suitable for the material. Each lithographic step defines a device level. During the fabrication in this way of ICs containing MOS or bipolar transistor devices, or both, a set of fiducial alignment marks known as registration marks are used. Each such mark has a registration feature. A set of at least three such marks is required per wafer. Each such mark, typically having the shape of a cross when viewed from above, is formed on the surface of the wafer in a dedicated registration mark area thereof. The position of the feature of a registration mark is defined in electron beam lithography as the centroid of the mark, and in other lithographies it is defined as either the centroid or an edge of the mark. The features of these registration marks are then used for aligning the wafer with respect to the lithographic writing tool being used—e.g., optical lithography or electron-beam-IC transistor devices—i.e., the device features located in dedicated device areas—are aligned with respect to the registration marks and hence with respect to one another as desired.

Inherent in every alignment of the position of a device feature with respect to a set of registration marks is an important, non-negligible alignment error, say $\pm e$. That is, the distance between a device feature and the relevant feature of the registration mark on a predefined level can vary by as much as $\pm e$, where $e$ represents a standard deviation, owing to unavoidable imperfections and uncontrollable random variations in the lithographic technique being used. Moreover, in cases where it is necessary to fabricate two different device levels using the same set of registration marks from an earlier level for both device levels, the standard deviation of the total alignment error in the position of one of the features with respect to the other is equal to $e\sqrt{2}$, i.e., an error deviation equal to almost one-and-one-half times the alignment deviation of a signal level. If each level is aligned to registration marks at different levels, the alignment can become progressively worse.

In the fabrication of MOS transistors, for example, a double misalignment problem associated with the respective features of the fabricated field oxide layer and the later fabricated polysilicon gate electrode layer arises if the same earlier set of registration marks is used for aligning both the field oxide and the gate electrode.

In the prior art of optical lithography, the double misalignment problem has been avoided by lithographing the registration marks in the field oxide layer simultaneously while lithographing the field oxide edges of devices being fabricated in the device area; and these registration marks in the field oxide layer are then used for aligning the polysilicon gate electrodes. In this way, since both the registration marks and device feature are on the same lithographic level, there is no misalignment between the edges of the field oxide layer located in the device areas relative to those located in the registration mark area. Subsequent alignment of the polysilicon gate electrode results in only a single alignment error $\pm e$, and not a double alignment error $e\sqrt{2}$, between the field oxide edges and the polysilicon gate electrode edges located in the device areas. However, when using lithographic techniques other than optical lithography, such as direct electron-beam-writing lithography—as for the purpose of achieving higher resolutions, for example, 0.3 micrometer feature sizes or less in the gate level—the edge of field oxide, being contiguous with the semiconductor, do not always supply sufficient contrast, with respect to the substrate, to enable detection by the beam of the position of the oxide edge with desired precision. In particular, the edge of the field oxide, especially in the case of thin field oxide, are not accurately determinable by observing the pattern of backscattering, for example, of the electron beam in neighborhoods of these edges. Hence, such a field oxide edge cannot always serve as the desirable precise registration mark, i.e., with the virtually zero misalignment. Thus, in prior art, a lithographic level has been defined solely for the purpose of alignment. Metal or metal silicide registration marks have been used in non-optical lithographies, but at the penalty of double misalignment.

SUMMARY OF THE INVENTION

The foregoing double misalignment problem is alleviated by fabricating an integrated circuit using self-aligned registration features having enhanced detectability, such as self-aligned metal or metal silicide registration marks. More specifically, the invention involves fabricating an integrated circuit at the surface of a semiconductor body by a method that includes the steps of (a) forming at the surface a first lithographically patterned layer of first material having a registration feature and a first device feature;

(b) enhancing the registration feature but not the device feature, to form an enhanced registration feature; and (c) forming at the surface a second lithographically patterned layer of second material having a second device feature, using the enhanced registration feature of the first patterned layer as a fiducial mark for aligning the second device feature with respect to first device feature.

The step of enhancing the registration feature serves to improve its detectability, as by an electron beam in electron beam lithography, whereby the double misalignment problem is avoided and the accuracy of alignment is improved. Also, in some embodiments of the invention, the enhancing step can be performed advantageously subsequent to earlier lithography pattern levels, subsequent to depositions of certain materials, such as polysilicon or resist and subsequent to high temperature processing, whereby the integrity and the accuracy of detectability of the registration feature is maintained.

In particular, the enhanced registration feature can be a boundary of an oxide layer with an enhancing metal or metal silicide layer.

BRIEF DESCRIPTION OF THE DRAWINGS

This invention together with its features and advantages may be better understood from the following detailed description in which.

Only for the sake of clarity, none of the drawings is to any scale.

Figure 1:
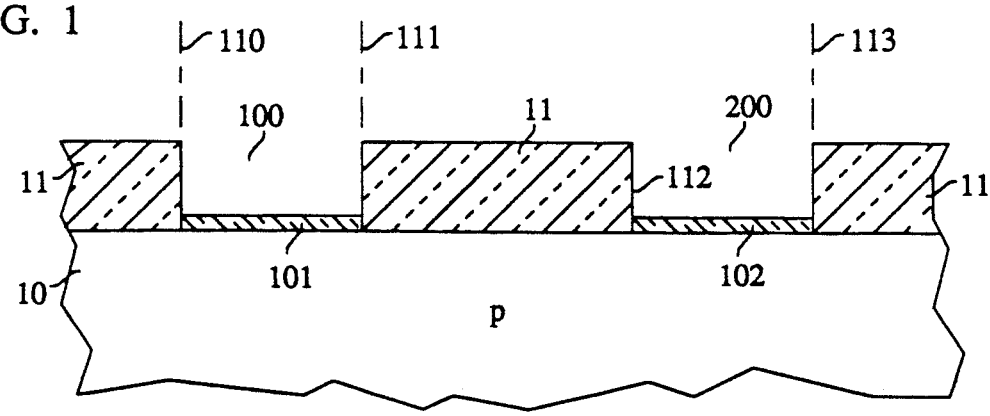
FIGS. 1–7 are cross-sectional views of successive stages of a portion of a semiconductor IC being fabricated in accordance with a specific embodiment of the invention.

FIG. 1 shown an initial stage of fabrication of illustratively an n-channel MOS transistor, in accordance with a specific embodiment of the invention. As known in the art, various impurity ion implantations steps can be performed at various fabrication stages, to adjust threshold voltages, for example, and these steps will not be described here.

As shown in FIG. 1, using standard techniques, the top surface of p-type semiconductive silicon body 10 is everywhere coated by a field oxide (silicon dioxide) layer 11 except at apertures 100 and 200 therein where gate oxide layers 101 and 102 are situated. The aperture 100 is located in a registration mark area; the aperture 200, in a device area. The aperture 100 advantageously is in the shape of a cross when viewed from above, and advantageously there are at least three such apertures (not shown) on the surface of the body 10. The field oxide layer 11 is relatively thick as compared with the gate oxide layers 101 and 102, as known in the art. Edges 110 and 111 define the registration mark, and edges 112 and 1134 define a device feature as delineated by direct electron-beam-writing lithography or even by optical lithography, for example —i.e., even by a less precise lithography than direct electron-beam-writing to be used, as described below, for the more critical subsequent lithographic steps.

Figure 2:
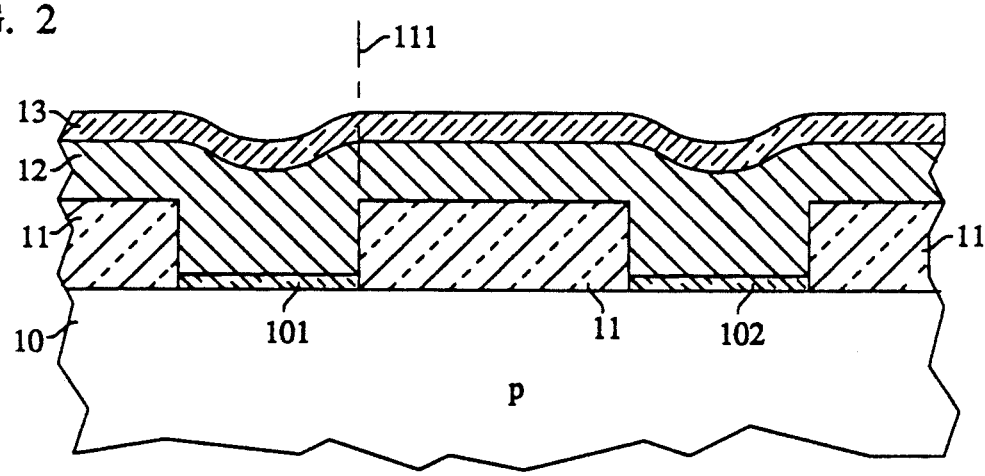

Next (FIG. 2), a polysilicon layer 12 is deposited conformally, and a protective silicon dioxide layer 13 is deposited over this polysilicon layer 12.

Figure 3:
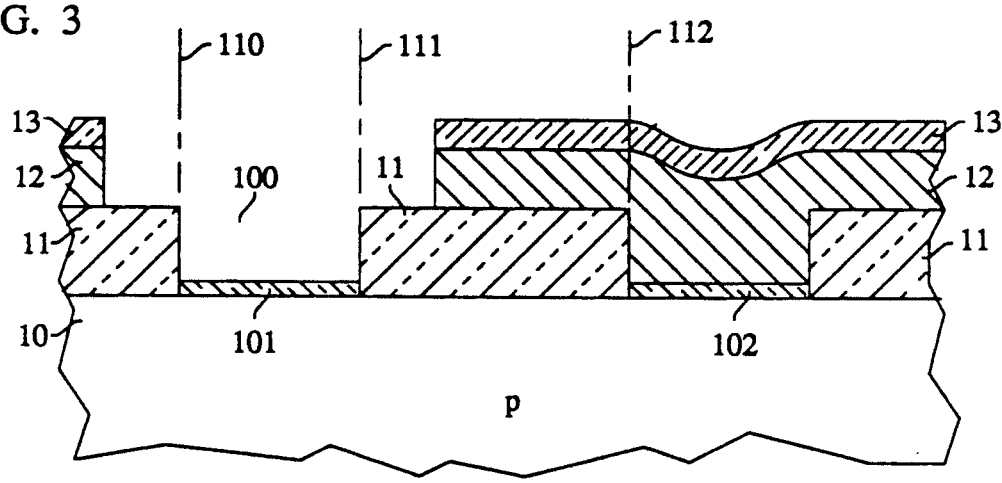

Then (FIG.3) the silicon dioxide layer 13 and the polysilicon layer 12 are etched selectively, by selective masking and etching at areas that encompass the aperture 100 but not the aperture 200. The alignment for this lithographic step is not as critical as subsequent alignments(s). The technique used thus to etch the polysilicon advantageously does not etch the underlying field oxide layer 11. The relatively thin gate oxide layer 101 is completely removed together with an insignificantly small thickness of the field oxide layer 11 and of the protective oxide layer 13.

Figure 4:
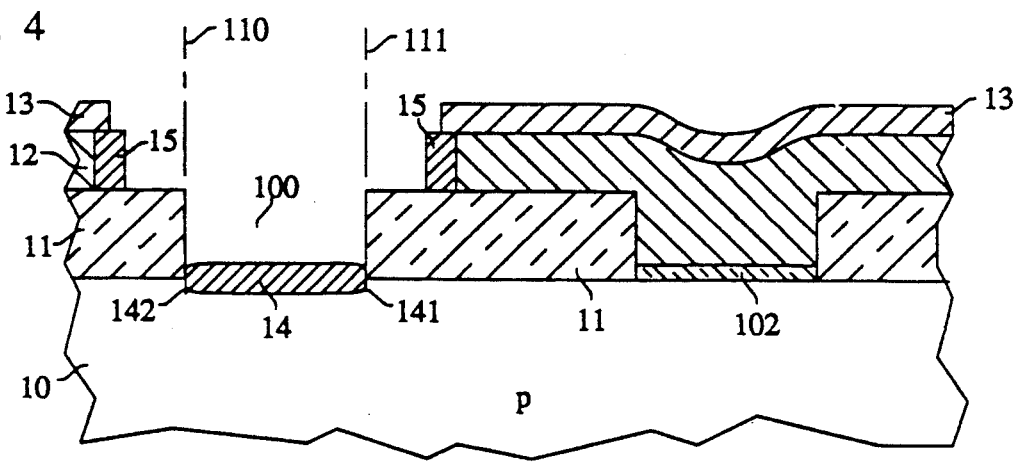

Next (FIG. 4), a layer of platinum is sputter deposited and sintered to form platinum silicide wherever the platinum contacts silicon. Then an etching in aqua regia is performed, whereby all platinum is removed, but platinum silicide layers 14 and 15 remain respectively on the top surface of the body 10 and the side surfaces of the polysilicon layer 12. Note that the right-hand and left-hand edges 141 and 142 of the silicide layer 14 are coincident with edges 111 and 110, respectively, of the field oxide layer 11. Because of its better contrast property, the silicide layer 14 effectively improves the detectability of the field oxide edge 110 and 111 by an electron beam during subsequent electron beam lithography. Thus the registration mark, defined by edges 110 and 111 of the field oxide layer 11, is enhanced by the silicide layer 14.

The silicide layers 15 located on the side surfaces of the polysilicon layer 12 do not play any useful role and will not be discussed further.

Figure 7:
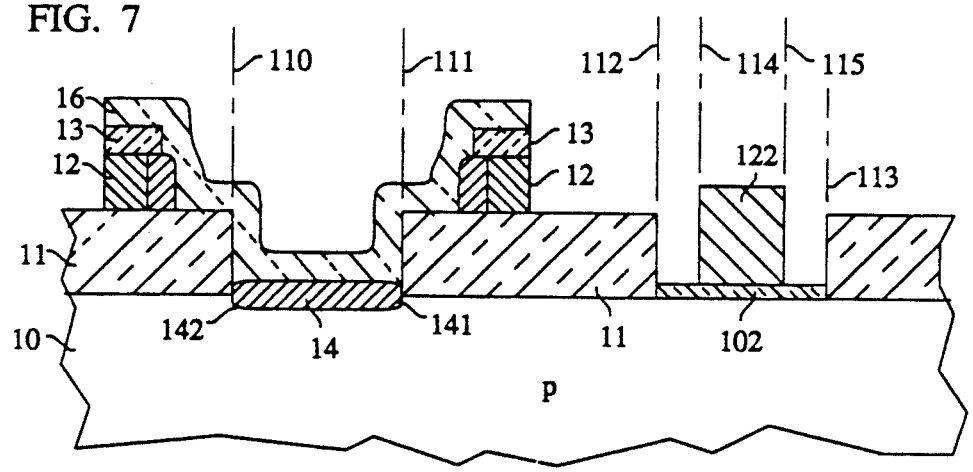
Figure 5:
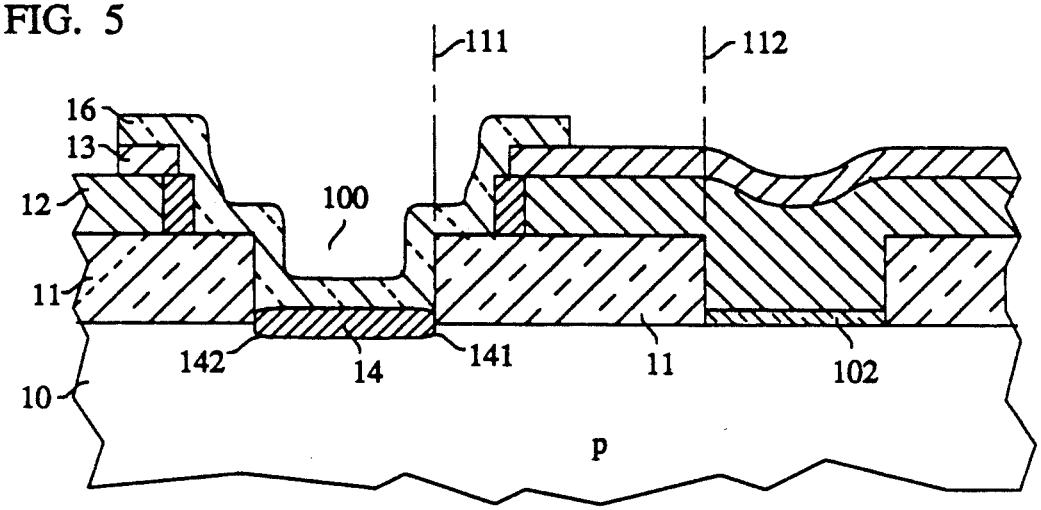
Figure 6:
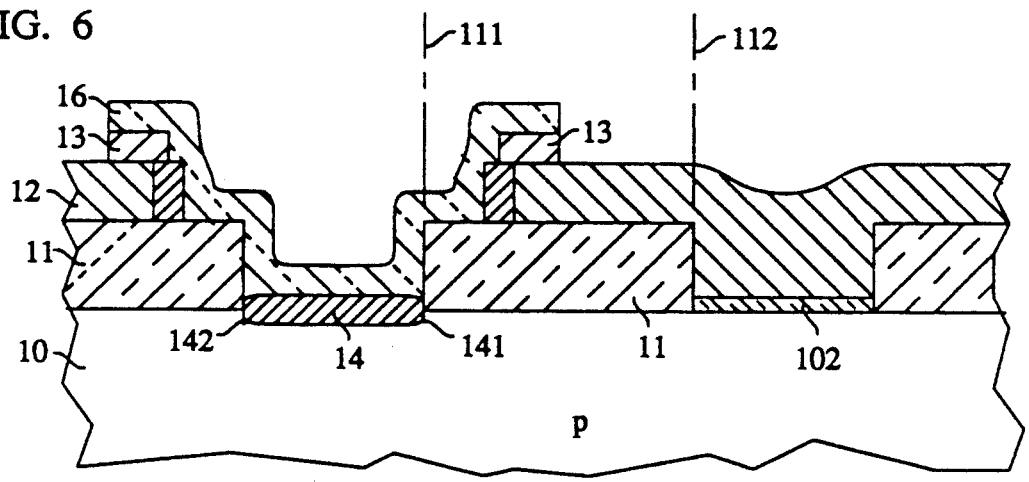

FIGS. 5–7 show how the edges 110 and 111 of the field oxide layer 11 as enhanced by the silicide layer 14, can be used to fabricate a gate electrode 122 (FIG. 7) of an MOS transistor. As indicated in FIG. 5, another protective layer 16—such as silicon nitride—is formed by deposition and standard optical lithographical patterning, with coarse alignment, so that it covers the top surface only in a limited area overlying the silicide layers 14 and 15.

Next (FIG. 6), using the protective layer 16 as a mask against etching, the silicon dioxide layer 13 can be removed everywhere except at areas underlying the protective layer 16. It should be noted that this (selective) removal of the silicon dioxide layer 13 may not be needed, depending upon the selection of subsequent fabrication techniques.

Next, in order to form a polysilicon gate electrode 122 (FIG. 7) having left-hand and right edges 114 and 115, respectively, a suitable resist layer (not shown) is deposited everywhere, as by spinning-on. This resist layer is then exposed to an electron beam at selected locations in accordance with the desired pattern of the polysilicon gate 122. The precise alignment of location s for impingement of the electron beam (writing) is determined by means of (backscattering) detection by the beam of the enhanced registration mark defined by the edges 110 and 111 of the field oxide layer 11, i.e., defined by means of the edges 141 and 142 of the silicide layer 14, which is more easily detectable by backscattering of an electron beam than are edges 110 and 111 of the field oxide layer 11 in the absence of the silicide layer 14. After this exposure to the electron beam, the resist layer is developed and the polysilicon layer is etched using the developed resist layer as a protective mask against the etching. In this way, the polysilicon gate electrode 122 is formed, with its left-hand and right-hand edges 114 and 115, respectively, having only a single alignment error with respect to the previously defined device feature in the field oxide layer 11, namely the left-hand and right-hand edges 112 and 113 thereof.

At the same time that this polysilicon gate electrode 112 (FIG. 7) is being formed, a set of polysilicon layers (not shown) can be formed in the shape of crosses which are suitable for use as registration marks during subsequent processing of higher levels of the devices for direct alignment to the gate level.

Thereafter a transistor device having the polysilicon electrode 122 as its gate electrode can be fabricated using known techniques, and thereafter by standard techniques there can be fabricated the source and drain regions, as well as electrical contacts thereto and the various desired metallizations. For example following formation of the source and drain zones by diffusion, the top surface of the structure shown in FIG. 7 can be coated with a dielectric layer of TEOS (tetra-ethyl-ortho-silicate); and then either the edges of the polysilicon or the metal silicide registration marks can be used to align an electron beam in conjunction with a lithographic technique for opening apertures in the layer of TEOS, as known in the art, in order to form electrical contacts to these zones.

Figure 8:
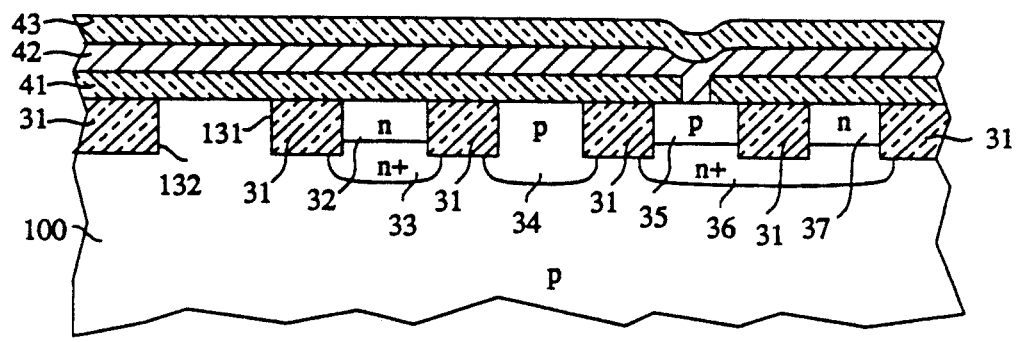
FIGS. 8–11 are cross-sectional views of successive stages of a portion of a semiconductor IC being fabricated in accordance with another specific embodiment of the invention.
Figure 9:
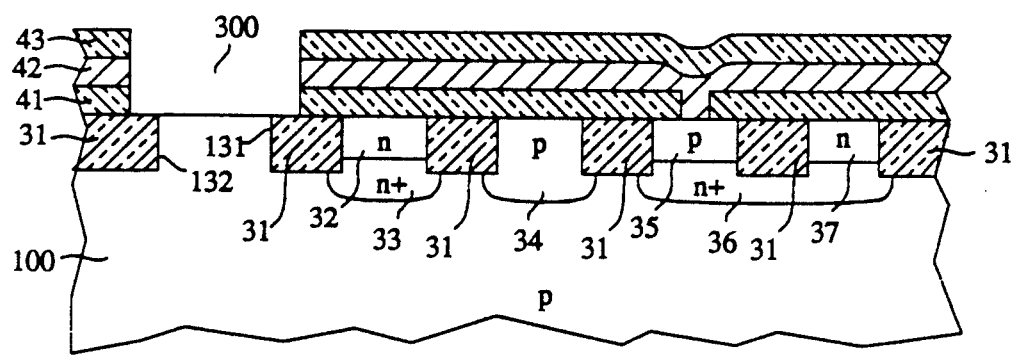
Figure 10:
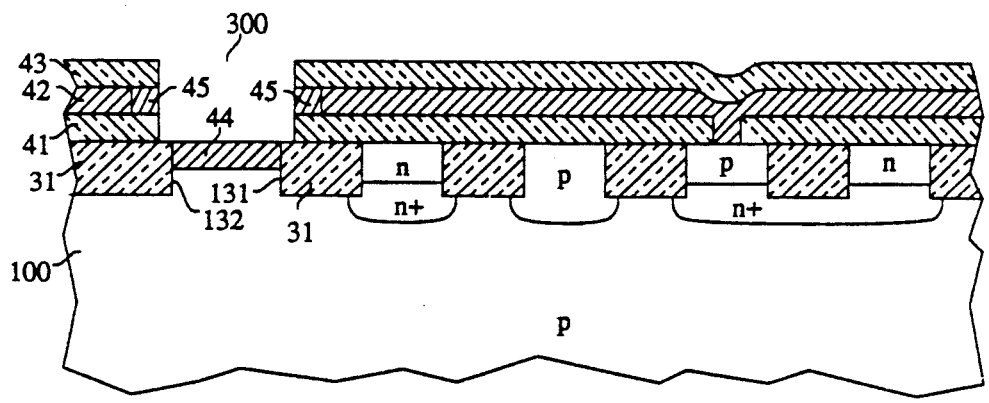
Figure 11:
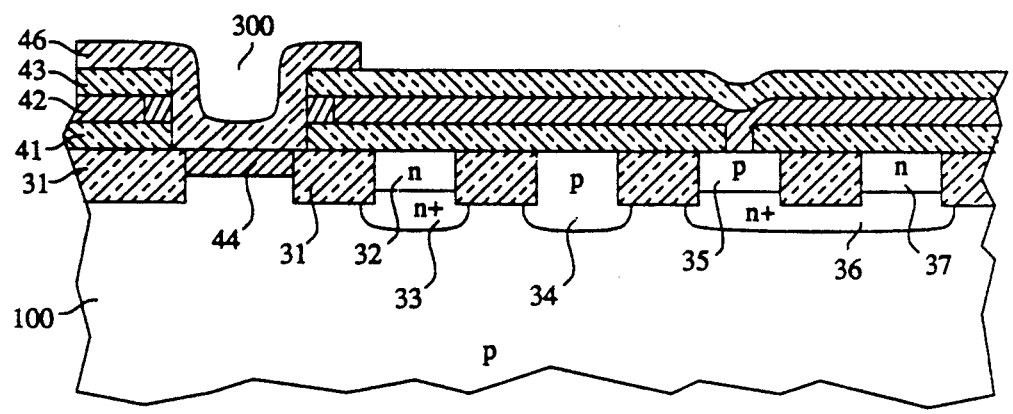

FIGS. 8-11 shown another specific embodiment of the invention —this one involving the edges of a buried isolation oxide instead of the edges of the raised field oxide described above in conjunction with FIGS. 1-7. As shown in FIG. 8, a p-type semiconductor body 100 has a patterned buried isolation oxide layer 31, which has lithographically defined edges 131 and 132, located at the top surface of the body. This buried oxide layer 31—along with n-type regions 32 and 37, p-type regions 34 and 35, and $n^{30}$ regions 33 and 36—typically is formed by means of standard non-critically aligned electron beam or optical lithographic techniques, along with deposition, planarization, and impurity ion implantation techniques.

The n-type region 32, together with the $n^{30}$ region 33, serves as an n-tub for a p-channel MOS transistor to be fabricated. The p-type region 34 serves as a p-tub for an n-channel MOS transistor to be fabricated. The p-type region 35 serves as a base zone of a bipolar pnp transistor being fabricated; the $n^{30}$ region 36, as a base region of the bipolar transistor; the n-type region 37, as a collector contact zone. The n-type regions 32 and 37 can be formed simultaneously; the p-type regions 34 and 35 can also be formed simultaneously; and the $n^{30}$ regions 33 and 36 can likewise be formed simultaneously. The registration area, instead of being a substrate p region (FIGS. 10-11), could be an impurity doped p region (similar to 34), or an n or an $n^{30}$ region (similar to 32 or 33), or a p or an $n^+$ region (similar to 35 or 36), whereby a mask level could be saved.

As further shown in FIG. 8 everywhere upon the top surface of the body 100 are grown or deposited a gate oxide layer 41, a polysilicon gate layer 42, and an insulating oxide layer 43.

the edges 131 and 132 of the oxide layer 31 are bounded by silicon material of the body 100, and therefore these edges ordinarily supply an undersirably small amount of observable contrast for use as an accurate registration mark. In order to enhance the observable contact, an aperture 300 (FIG. 9) is formed, typically by conventional photolithographic masking and etching. Next, a layer of platinum is deposited everywhere over the top surface and is sintered to form platinum silicide whenever silicon is exposed. Thereby, platinum silicide layers 44 and 45 (FIG. 10) are formed—i.e., wherever the underlying surface material is silicon. The platinum silicide layer 44, located on the exposed silicon surfaces of the body reinforces (enhances) the edges 131 and 132 of the oxide layer 31; the platinum silicide layers 45 and 46, located on the sidewalls of the polysilicon layer 42, are not significant. It should be understood that, as viewed from the top, the platinum silicide layer 44 is ordinarily in the shape of a cross and that at least two other such layers in the form of crosses are simultaneously fabricated.

Next (FIG. 11), a protective silicon nitride layer 46 is deposited, and is masked and etched so as to cover the top surface of the structure which is being fabricated only in a limited neighborhood of the aperture 300.

The edges 131 and 132 of the buried oxide layer 31, being reinforced by the silicide layer 44, can then be used to fabricate, as by electron beam lithography, a p-channel MOS transistor in the n-tub 32, an n-channel MOS transistor in the p tub 34, and a bipolar pnp transistor having the p-type region 35 as its base zone, and the $n^+$ region 36 as its collector zone—without the problem of double misalignment.

Although the invention has been described in detail in terms of specific embodiments, various modifications can be made without departing from the scope of the invention. For example, silicide-forming metals other that platinum can be used for the metal silicide layer 14, such as cobalt, titanium, tungsten or tantalum. Moreover, mixtures of these metals can be used, such as titanium 10% by weight and tungsten 90% by weight. Also, instead of sputter deposition, evaporation or plating or chemical vapor deposition can be used to deposit such metals. Finally, instead of metal silicide, metals—such as tungsten, nickel, cobalt, platinum, or palladium—deposited either directly upon silicon itself or upon a thin layer of metal silicide or silicon, can be sued for mask feature enhancement purposes, by selective deposition of such metals by such techniques as selective chemical vapor deposition or plating. Further, in addition to n-channel MOS transistors (FIG. 7), p-channel MOS transistors can be fabricated, as by using an n-tub in the silicon body 10, as known in the art. Also, instead of electron beam lithography, other lithographies can be used in conjunction with the enhanced registration feature, such as X-ray lithography.

We claim:

1. A method of fabricating an integrated circuit at a surface of a semiconductor body comprising the steps of
    (a) forming at the surface a first lithographically patterned layer of first material having a registration feature and a first device feature;
    (b) enhancing the registration feature but not the device feature, to form an enhanced registration feature, said enhancing step comprising forming a self-aligned layer of second material having at least one edge which is substantially coincident with an edge of the registration feature of the first patterned layer of first material, the second material being different from the semiconductor and the first material; and
    (c) forming at the surface a second lithographically patterned layer of third material having a second device feature, using the edge of the enhanced registration feature as a fiducial mark for aligning the second device feature with respect to first device feature.

2. The method of claim 1 in which the step of forming the second lithographically patterned layer includes using a direct writing electron beam to delineate the patterning of the second layer.

3. The method of claim 1 in which the second material is platinum, cobalt, titanium, tungsten or tantalum or silicide thereof or mixture thereof.

4. The method of claim 1 in which the second material is a metal or metal silicide or mixture thereof.

5. The method of claim 1 in which localized impurity-doped device regions located at the surface of the body are formed prior to enhancing the registration feature.

6. The method of claim 5 in which the body is silicon and in which the first lithographically patterned layer is a buried silicon dioxide layer located at the surface of the body.

7. The method of claim 1 in which the first layer of first material is an oxide layer.

8. The method of claim 7 in which the third material is polysilicon.

9. The method of claim 7 in which the second material is a metal or metal silicide or mixture thereof.

10. The method of claim 7 in which the second material is platinum, cobalt, titanium, tungsten or tantalum or silicide thereof or mixture thereof.

11. The method of claim 7 in which the body is silicon and the first material is silicon dioxide.

12. The method of claim 11 in which the second material is a metal or metal silicide or mixture thereof.

13. The method of claim 12 in which the second material is platinum, cobalt, titanium, tungsten or tantalum or silicide thereof or mixture thereof.

14. The method of claim 11 in which the third material is polysilicon.

* * * * *

UNITED STATES PATENT AND TRADEMARK OFFICE
CERTIFICATE OF CORRECTION

PATENT NO. : 4,992,394

DATED : 2/12/91

INVENTOR(S) : R. L. Kostelak, Jr., W. T. Lynch, S. Vaidya

It is certified that error appears in the above-identified patent and that said Letters Patent is hereby corrected as shown below:

Column 3, line 36, "1134" should read --113--.
Column 5, line 10, "$n^{30}$" should read --$n^+$--.
Column 5, line 15, "$n^{30}$" should read --$n^+$--.
Column 5, line 20, "$n^{30}$" should read --$n^+$--.
Column 5, line 25, "$n^{30}$" should read --$n^+$--.
Column 5, line 28, "$n^{30}$" should read --$n^+$--, Signed and Sealed this Twenty-second Day of September, 1992

Attest:

DOUGLAS B. COMER

Attesting Officer

Acting Commissioner of Patents and Trademarks